United States Patent [19]

Du et al.

[11] Patent Number: 5,901,161
[45] Date of Patent: May 4, 1999

[54] INITIALIZATION DATA REDUNDANCY SYSTEM

[75] Inventors: Vincent V. Du; Masanobu Kimoto, both of San Diego, Calif.

[73] Assignees: Sony Corporation, Tokyo, Japan; Sony Electronics, Inc., Park Ridge, N.J.

[21] Appl. No.: 08/958,045

[22] Filed: Oct. 27, 1997

[51] Int. Cl.[6] .................................................. G06F 11/00
[52] U.S. Cl. ............................................................ 371/211
[58] Field of Search ................................... 371/21.1, 21.2, 371/21.3, 21.4, 21.6; 395/182.03; 365/201

[56] References Cited

U.S. PATENT DOCUMENTS 5,511,003  4/1996  Agarwal ................................... 395/200
5,732,212  3/1998  Perholtz et al. ......................... 395/200

*Primary Examiner*—Vincent P. Canney
*Attorney, Agent, or Firm*—Blakely, Sokoloff, Taylor & Zafman LLP

[57] ABSTRACT

The present invention discloses a method and apparatus for providing error detection capability for initialization data stored in a non-volatile memory used in a video monitor. The method comprises the steps of: (1) storing N test values in N distinct locations in the non-volatile memory; (2) reading the N stored test values from the non-volatile memory, each test value being read for K times; (3) selecting N read test values representative of the N stored test values; (4) comparing the N read test values with N corresponding check values; and (5) if the N read test values are equal to the N corresponding check values, reading the initialization data from the non-volatile memory.

12 Claims, 5 Drawing Sheets

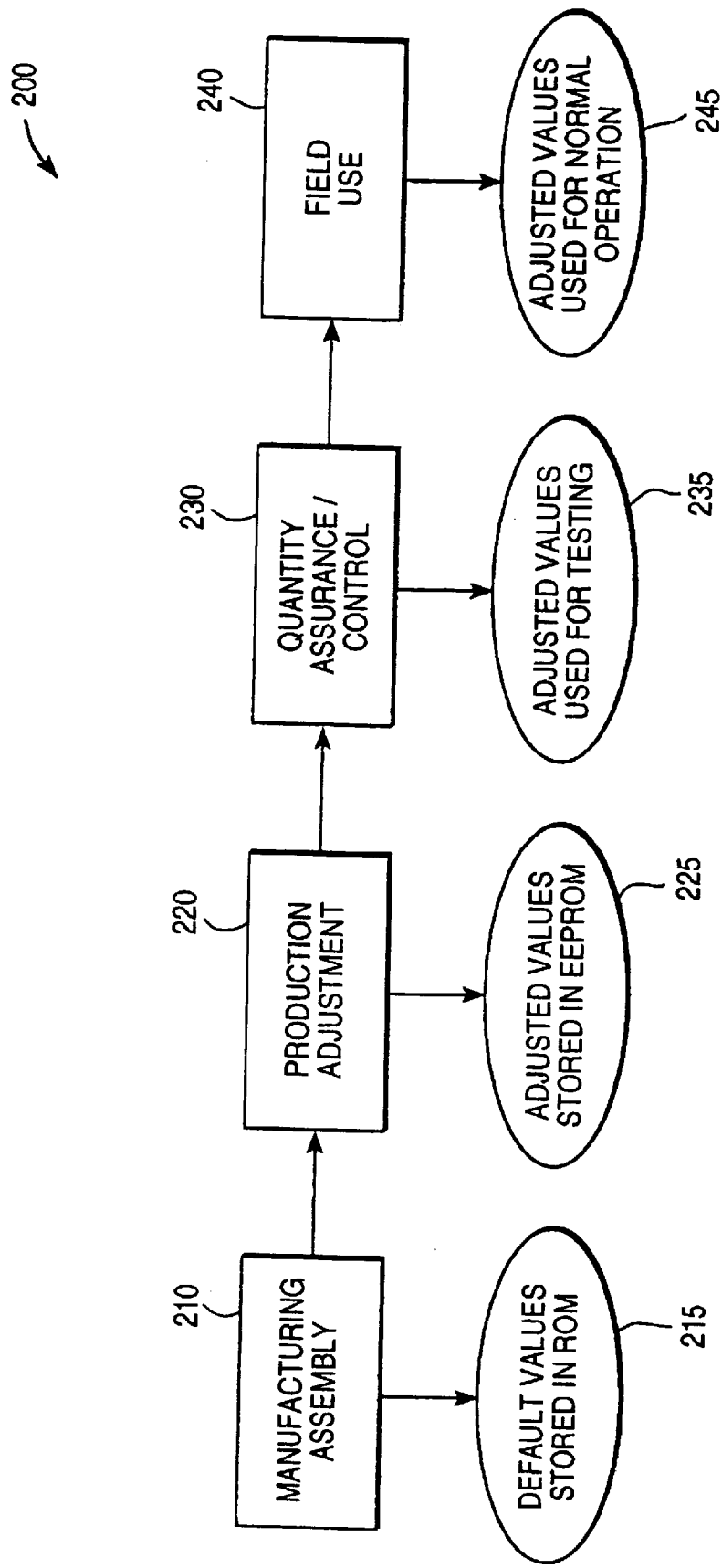
FIG_2

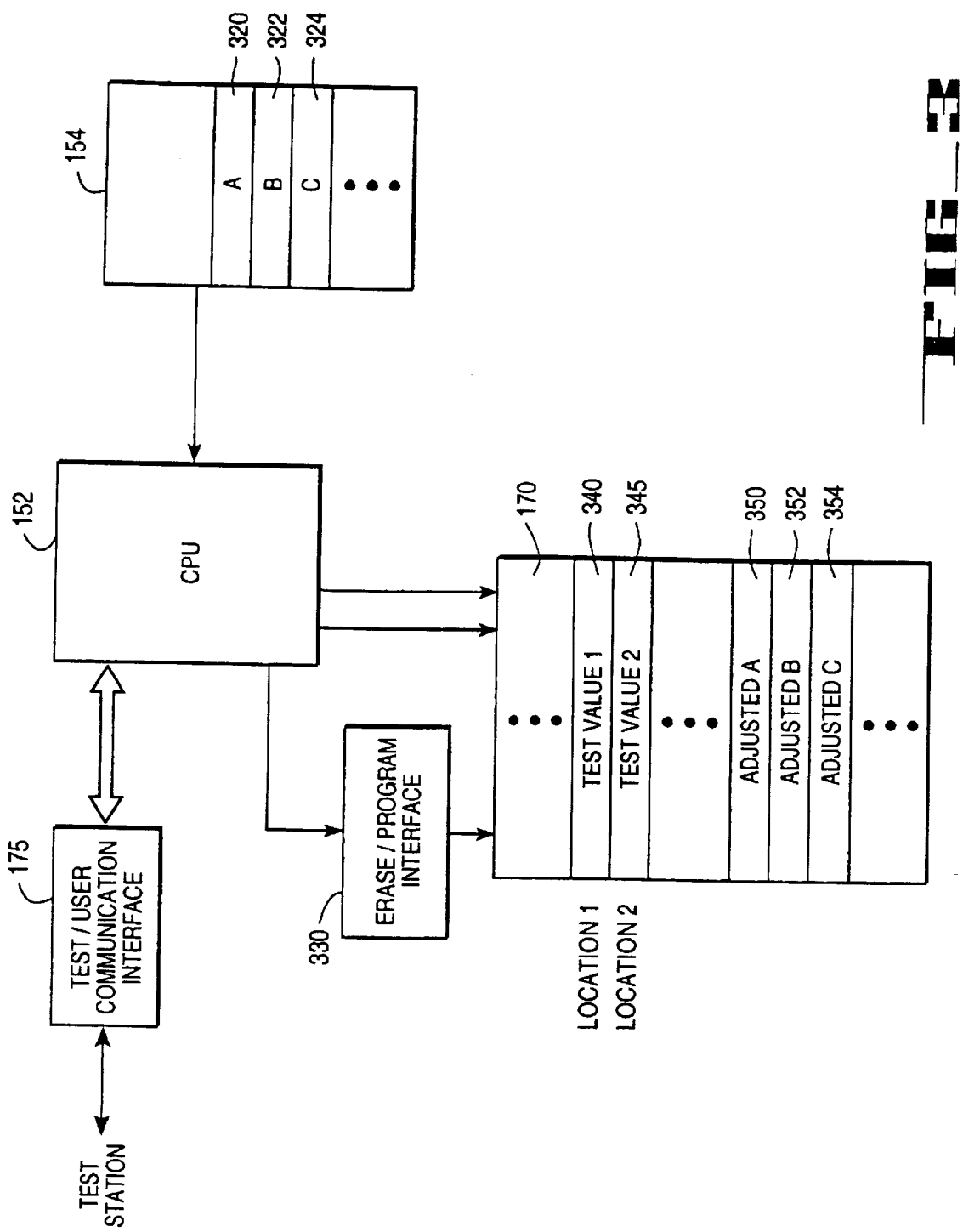
FIG_3

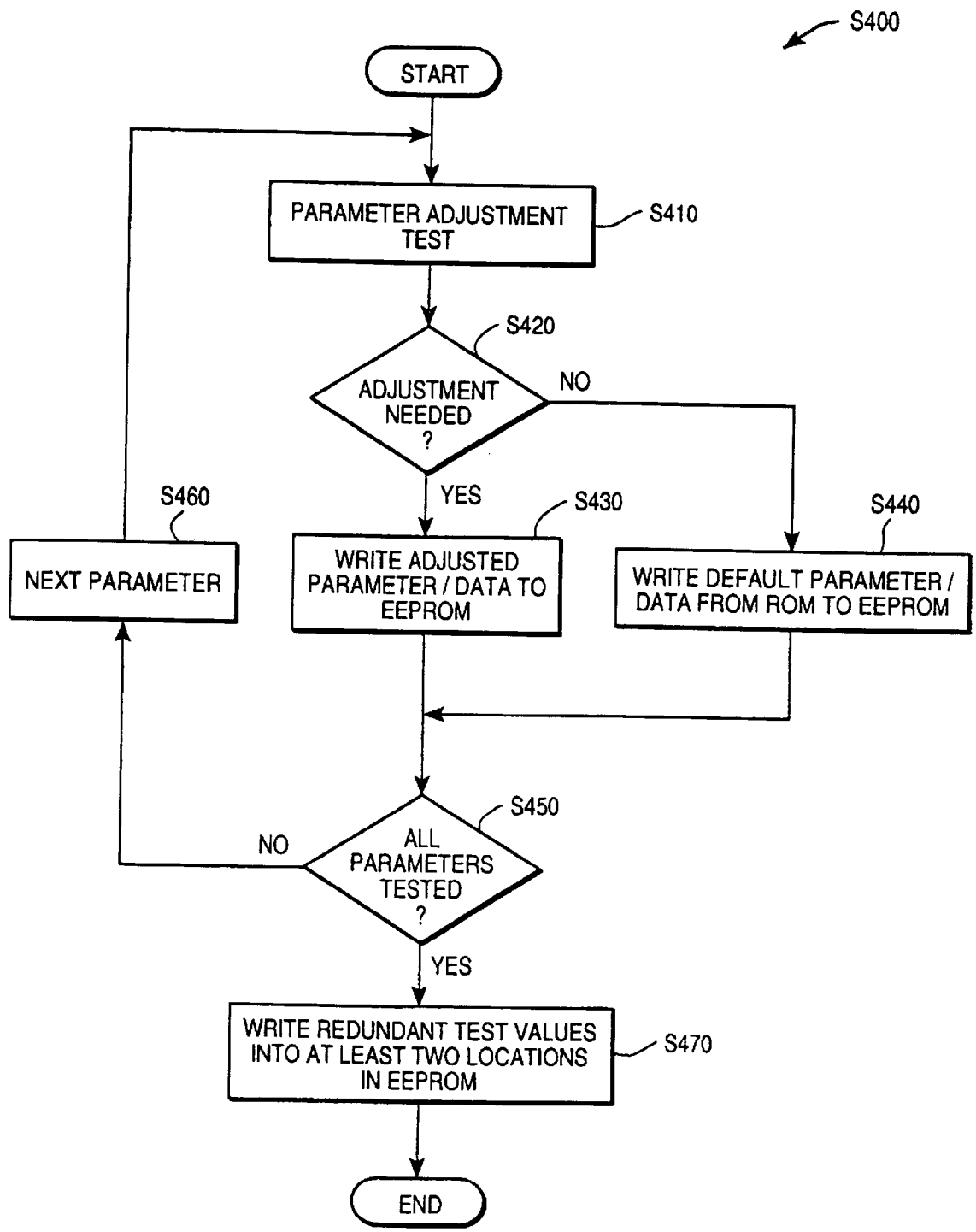
FIG_4

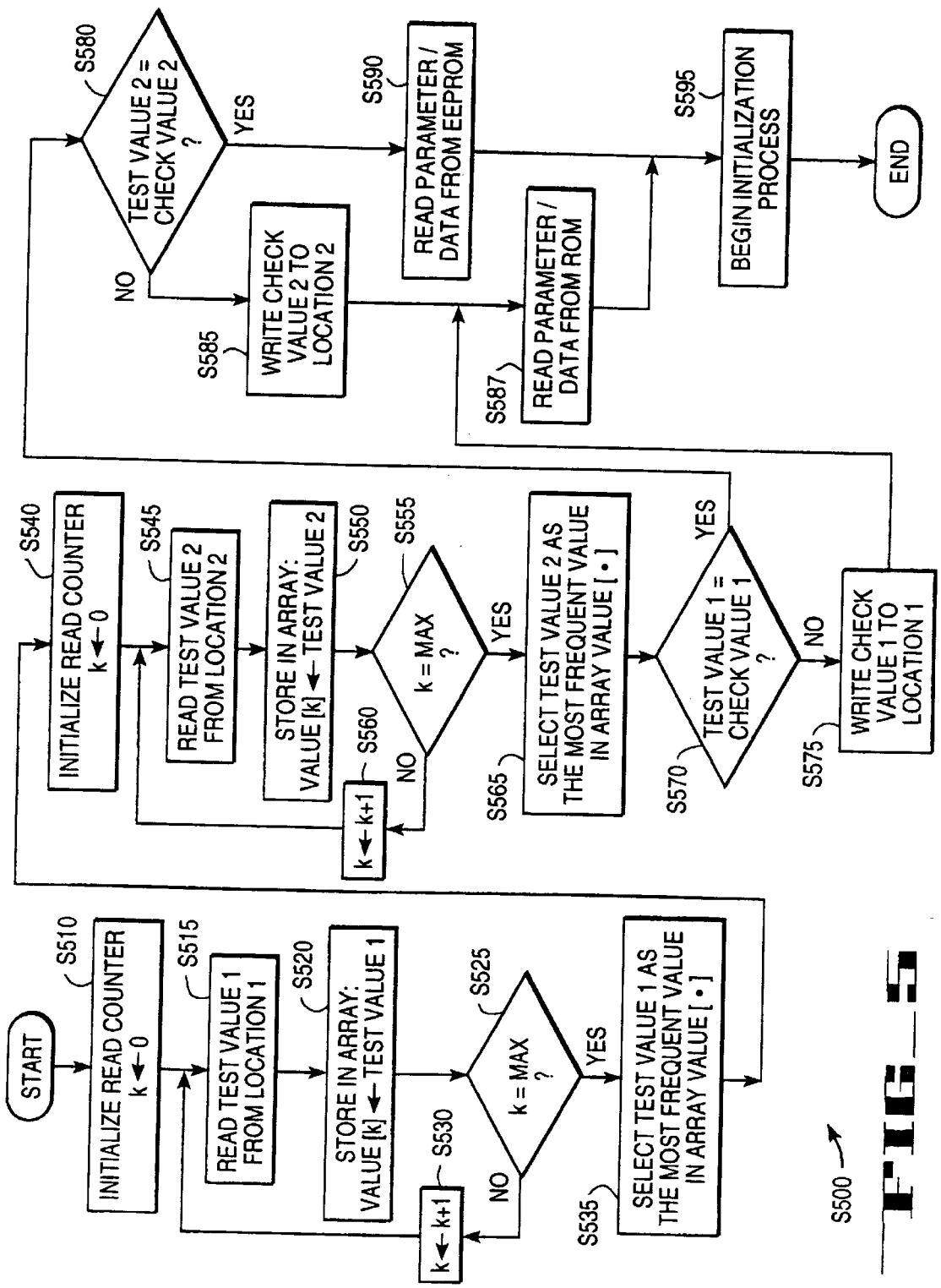
FIG_5

INITIALIZATION DATA REDUNDANCY SYSTEM

BACKGROUND OF THE INVENTION

1. Field of the Invention

The present invention relates to redundancy for error detection. In particular, the present invention relates to initialization data redundancy system for multi-frequency video monitor.

2. Description of Related Art

Multi-frequency video monitors require initialization data for initial configuration. Default values for these initialization data are usually determined and stored in read only memory (ROM) during manufacturing and assembly.

During production adjustment, these default values are adjusted according to calibration results. The adjusted data are stored in EEPROM or other forms of non-volatile memory. Subsequently, the adjusted values are used in quality assurance/ control and field use.

Data read from EEPROM may be corrupted by noise and other sources of errors. When this occurs, the adjusted values become erroneous, resulting in incorrect operation of the video monitor during quality assurance/ control and in the field. These errors cause frequent returns of products, increasing costs for both the manufacturer and the customers.

Accordingly, there is a need to provide an apparatus and method for providing an error detection capability based on the use of redundancy in storing and reading initialization data.

SUMMARY OF THE INVENTION

The present invention discloses a method and apparatus for providing error detection capability for initialization data stored in a non-volatile memory used in a video monitor. The method comprises the steps of: (1) storing N test values in N distinct locations in the non-volatile memory; (2) reading the N stored test values from the non-volatile memory, each test value being read for K times; (3) selecting N read test values representative of the N stored test values; (4) comparing the N read test values with N corresponding check values; and (5) if the N read test values are equal to the N corresponding check values, reading the initialization data from the non-volatile memory.

BRIEF DESCRIPTION OF THE DRAWINGS

The features and advantages of the present invention will become apparent from the following detailed description of the present invention in which:

FIG. 2 is a diagram illustrating one process in which initialization data are used.

FIG. 3 is a diagram illustrating one embodiment of a redundant scheme for reading initialization data in EEPROM.

FIG. 4 is a flowchart illustrating one embodiment of a process of writing the initialization data during production adjustment.

FIG. 5 is a flowchart illustrating one embodiment of a process of reading the initialization data during quality assurance/ control or field use.

DESCRIPTION OF THE PRESENT INVENTION

Figure 1:
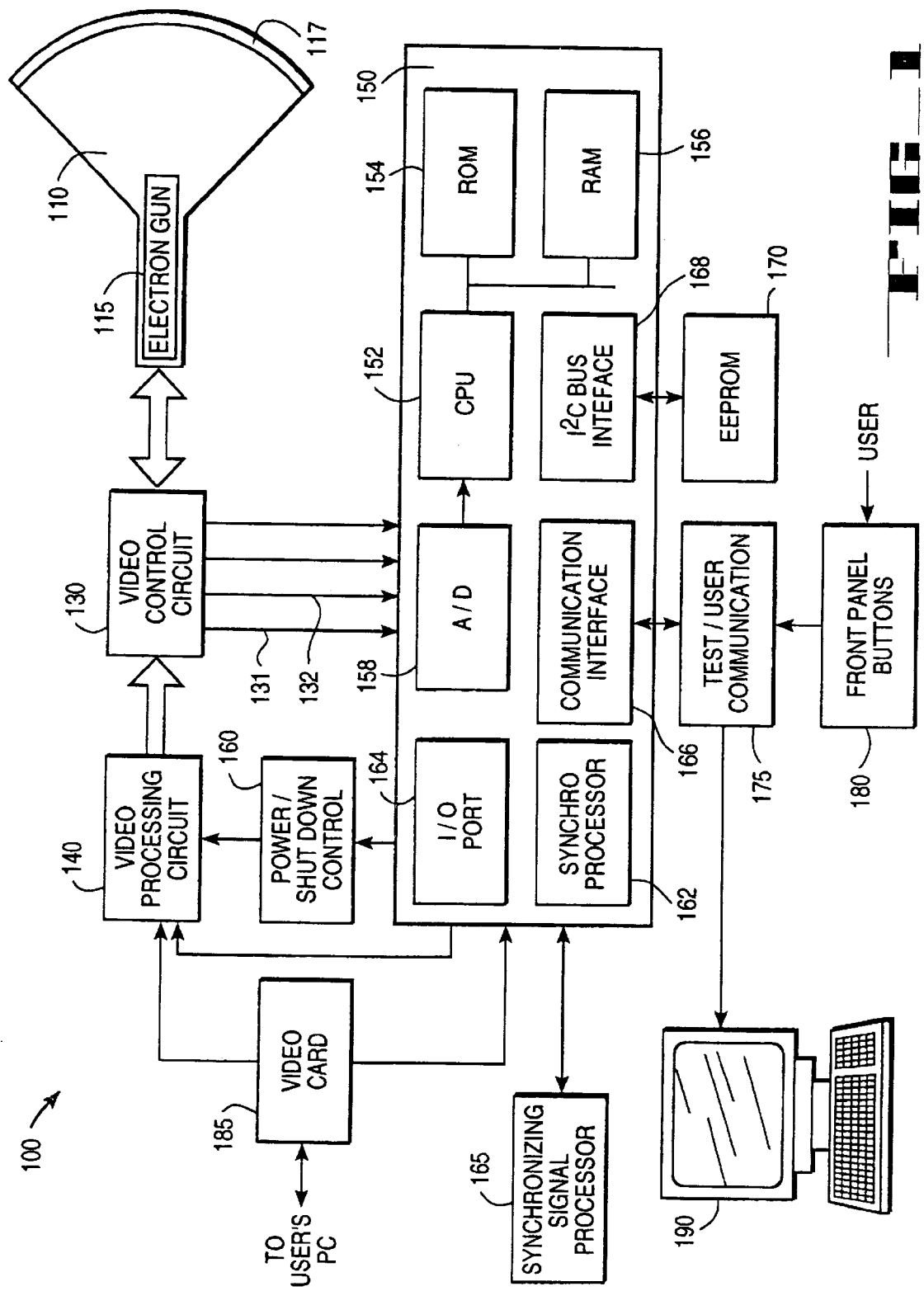
FIG. 1 is a block diagram illustrating one embodiment of a video monitor system that operates in accordance with the teachings of the present invention.

The present invention discloses a method for providing an error detection capability for reading initialization data stored in electrically erasable programmable read only memory (EEPROM). Redundant test data are provided in the EEPROM. An error condition occurs when the redundant data do not match the check data. When this occurs, default values stored in read only memory (ROM) are used.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Referring to FIG. 1, a block diagram illustrating one embodiment of a video monitor system 100 that operates in accordance with the teachings of the present invention is shown. The system 100 comprises a picture tube 110, a video control circuit 130, a video processing circuit 140, a processor 150, a power/shutdown control circuit 160, a synchronization signal processor 165, an electrically erasable programmable read only memory (EEPROM) 170, a test/user communication interface circuit 175, a front panel 180, a video card 185, and a test station 190.

Picture tube 110 contains electron gun assembly 115 and phosphor screen 117. Electron gun assembly 115 typically comprises three electron guns corresponding to the red, green, and blue colors. The electron guns emit electron beams that strike the corresponding phosphor to produce picture elements on the screen display.

Video control circuit 130 contains circuitry that control the beam currents and supply voltages to the electron gun assembly 115. The video control circuit 130 also provides feedback information on the operational parameters of the video system. Four important parameters that affect the operation of the video monitor are: the automatic beam current, the high voltage level, the horizontal scan present signal, and the vertical scan present signal. The ABL is expressed as a direct current (DC) voltage which is connected to one analog input channel on the processor 150 via signal line 131. The high voltage level is also a DC voltage connected to one analog input channel on the processor 150 via signal line 132. The horizontal and vertical scan present signals are connected to the input port lines on the processor 150 to the synchro processor 162.

The video processing circuit 140 performs the necessary video control functions. Examples of these control functions include generation of the beam currents, high voltage control, horizontal synchronizing signal, and vertical synchronizing signal. The video processing circuit 140 receives signals from the video card 185, the processor 150, and the power/shutdown control circuit 160.

The processor 150 comprises a central processing unit (CPU) 152, a read only memory (ROM) 154, a random access memory (RAM) 156, and analog-to-digital converter (ADC) 158, a synchro processor 162, an input/output port 164, a communication interface 166, and an I²C bus interface 168. The processor 150 may be any microprocessor or microcontroller. In one embodiment, processor 150 is a microprocessor having part number ST7275, manufactured by SGS Thomson. The ADC converts an analog voltage to an 8-bit digital data. An analog multiplexer (not shown) is used to selects an analog input voltage from a number of analog inputs for conversion.

The power/ shutdown control circuit 160 receives signal from the processor 150 to generate signal to the video processing circuit 140. When a shutdown condition occurs, the power/shutdown control circuit 160 receives a shutdown command signal from the processor 150. The power/shutdown control circuit 160 then proceeds to shutdown the video processing circuit 140 and other functional circuitry in the video monitor system 100.

The synchronization signal processor 165 receives synchronizing signals from the processor 150 and provides various synchronization functions such as vertical and horizontal corrections. In one embodiment, the synchronization signal processor 165 is a processor having part number uPC1886CT manufactured by NEC Corporation in Japan.

The EEPROM 170 stores status information, monitor information, initialization information and other operational parameters. The EEPROM 170 is connected to the Inter-Integrated Circuit ($I^2C$) bus interface 166 inside the processor 150. The $I^2C$ bus is a serial bus for communication between the processor 150 and the EEPROM 170.

The test/user communication interface 175 provides input/output communication to the test station 190 and the front panel 180. The test/user communication interface 175 is connected to the communication interface 166 inside the processor 150. The communication may be serial or parallel.

The front panel 180 provides user interface with buttons or switches. The buttons include a MENU button, and other functional buttons to control the operation of the video monitor.

The video card 185 provides video control information and signals to the video processing circuit 140 and the processor 150. The video card 185 is usually a graphics controller card that stores graphic data and generates horizontal and vertical synchronizing signals. The video card 185 is interfaced with the user's computer system.

The test station 190 is a PC with its own monitor and keyboard. The test station communicates with the processor 150 via the test/user communication interface 175. The test station has several modes of operation. During product adjustment, the test station 190 allows test personnel to adjust functional parameters such as the initialization data, and calibration parameters. When the product is returned for repair, the test station 190 can be used to inquire the nature of the failure. The status information stored in the EEPROM 170 can be retrieved and used by the test station 190.

Referring to FIG. 2, a diagram illustrating the system chain 200 involved in the use of initialization data. The system chain 200 comprises a manufacturing phase 210, a production adjustment phase 220, a quality assurance/control phase 230, and a field use phase 240.

The manufacturing phase 210 includes the determination of the default initialization data. These default data are based on the basic operational parameters of the video monitor as manufactured. The default values are stored in read only memory (ROM) in a process 215. In one embodiment, the ROM containing the default values is part of the processor 150 as shown in FIG. 1.

The production adjustment phase 220 adjusts the initialization based on the particular parameters of each individual video monitor. Calibration is provided to ensure that each individual video monitor parameters are proper. A process 225 stores these adjusted values in electrically erasable programmable read only memory (EEPROM).

The quality assurance/control phase 230 performs additional tests and quality control to ensure the video monitors meet acceptable standards. A process 235 utilizes the adjusted values stored in EEPROM for testing and checking purposes.

The field use phase 240 uses the product in the normal operation mode. A process 245 utilizes the adjusted values stored in EEPROM for normal use. During this time, if there is any problem caused by the initialization data, the product will be shipped back for repair.

Referring to FIG. 3, a diagram illustrating one embodiment of a redundant scheme for reading initialization data in EEPROM is shown.

The CPU 152 is interfaced to the test/user communication interface 175 to exchange information with the test station. The initialization data are stored in ROM 154. As an example, the initialization data include parameter A 320, parameter B 322, and parameter C 324. The CPU 152 communicate with the EEPROM 170 via the $I^2C$ bus. An erase/program interface 330 provides proper control signals to the EEPROM 170 for erasing and program the EEPROM 170.

Due to noise and other environmental conditions, data transferred over the $I^2C$ bus are subject to errors. These errors cause the test data written into the EEPROM 170 to be read incorrectly. As a result, the adjusted values stored in the EEPROM are not used and the initialization data in the ROM are used, erroneously, instead. To provide error detection capability to avoid incorrect operation due to erroneous readings, a redundancy scheme is employed. This redundancy scheme is based on both hardware redundancy and time redundancy. The hardware redundancy involves the use of multiple test data stored in the EEPROM 170. The time redundancy involves repeated readings of the test data by the CPU 152.

The EEPROM 170 stores redundant test values and the adjusted parameters. In one embodiment, there are two test values: a first test value 340 and a second test value 345, which are stored in locations and location 2, respectively. Locations 1 and 2 may be any location on the EEPROM 170. In one embodiment, locations 1 and 2 are consecutive locations. Any larger number of test values can be used to increase the redundancy and thus improves the reliability of the error detection capability. The first test value 340 and the second test value 345 may be any constants different from each other. In one embodiment, the constant for the first test value is a first check value having alternate bits 0 and 1, such as A5H (where H indicates a hexadecimal notation). The constant for the second test value is a second check value which is complement to the first check value, e.g., 5AH. Other check patterns can be employed, such as 0FH, F0H, B3H, and 3BH. The selection of the check value is based on some criteria of the characteristics of the communication medium. The adjusted parameters are stored in the EEPROM 170 as adjusted parameter A 350, adjusted parameter B 352, and adjusted parameter C 354. These adjusted parameters and the redundant test values are written into the EEPROM 170 during the production adjustment phase as will be explained next.

Referring to FIG. 4, a flowchart illustrating one embodiment of a process S400 to write the initialization data during the production adjustment phase is shown.

From the START state, the process S400 enters step S410 to perform the parameter adjustment test. The adjustments are made based on some test and calibration procedures. The process S400 enters the decision step S420 to determine if any adjustment is needed for a particular parameter. If no adjustment is needed, the default parameter/data is read from the ROM and written to the EEPROM. If adjustment is needed, the adjusted parameter/data is written to the EEPROM and the corresponding parameter/data in the ROM is ignored.

Then the process S400 enters decision step S450 to determine if all parameters have been tested. If NO, the process S400 goes to step S460 to test the next parameter, and returns to step S410. If all parameters have been tested, the process S400 enters step S470 to write the redundant test values into the EEPROM. In one embodiment, there are two redundant test values: the first test value and the second test value to be written into locations 1 and 2 as shown in FIG. 3. After the test values are written into the EEPROM, the process S400 is terminated.

Referring to FIG. 5, a flowchart illustrating one embodiment of a process S500 to read the initialization data is shown.

From the START state, the process S500 enters step S510 to initialize a read counter k to zero. The read counter is used to implement the time redundancy scheme. Then the process S500 enters step S515 to read the first test value from location 1. This first test value is then stored in an array VALUE[k]. Then the process S500 enters decision step S525 to determine if the read counter has reached a predetermined maximum value. In one embodiment, this predetermined maximum value is 20. If not, the read counter is incremented by one in step S530 and the process S500 returns to read the first test value from location 1 again in step S515. If the read counter has reached the maximum value, the process S500 enters step S535. In step S535, the test value 1 is selected as the most frequent value in the array VALUE. Due to time redundancy, the most frequent value should represent the correct value read from location 1. In case of ties, a random selection can be used. The process S500 then enters step S540 to initialize the read counter k to zero for the second test value.

Then the process S500 enters step S545 to read the second test value from location 2. This second test value is then stored in an array VALUE[k]. Then the process S500 enters decision step S545 to determine if the read counter has reached a predetermined maximum value. If not, the read counter is incremented by one in step S550 and the process S500 returns to read the first test value from location 2 again in step S545. If the read counter has reached the maximum value, the process S500 enters step S565. In step S565, the test value 2 is selected as the most frequent value in the array VALUE. Due to time redundancy, the most frequent value should represent the correct value read from location 2. In case of ties, a random selection can be used.

The process S500 then enters decision step S570 to determine if the first test value is equal to the first check value. If NO, the process S500 enters step S575. In step S575 the first check value is written to location 1 of EEPROM. The process S500 enters step S587. If YES, the process S500 enters decision step S580 to determine if the second test value is equal to the second check value. If NO, the second check value is written to location 2 in the EEPROM in step S585, and then the process S500 enters step S587. If YES, the process S500 enters step S590 to read the parameters/ data from EEPROM. In step S587, the process S500 reads parameters/data from ROM. The process S500 then enters step S595 to begin the initialization process using the initialization data either from the EEPROM or from ROM.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for providing error detection of initialization data stored in a non-volatile memory used in a video monitor, the method comprising steps of:

storing N test values in N distinct locations in the non-volatile memory;

reading the N stored test values from the non-volatile memory, each test value being read for K times;

selecting N read test values representative of the N stored test values;

comparing the N read test values with N corresponding check values; and if the N read test values are equal to the N corresponding check values, reading the initialization data from the non-volatile memory.

2. The method of claim 1 further comprises a step of reading default data from a read-only memory if at least one of the N read test values is not equal to a corresponding check value in the N check values.

3. The method of claim 1 wherein N is equal to two.

4. The method of claim 1 wherein the non-volatile memory is an electrically erasable programmable read only memory (EEPROM).

5. The method of claim 3 wherein the stored test values are complementary.

6. The method of claim 1 wherein K is less than 21 and greater than 1.

7. A system for providing error detection of initialization data used in a video monitor, the system comprising:

a processor; and a non-volatile memory coupled to the processor for storing N test values in N distinct locations and the initialization data, each of the N test values being read by the processor for K times, the N read test values being selected representative of the N stored test values, the N read test values being compared with N corresponding check values, and the initialization data being read by the processor if the N read test values are equal to the N corresponding check values.

8. The system of claim 7 further comprises a read-only memory (ROM) which is coupled to the processor for storing default data, the default data being read by the processor if at least one of the N read test values is not equal to a corresponding check value in the N check values.

9. The system of claim 7 wherein N is equal to two.

10. The system of claim 7 wherein the non-volatile memory is an electrically erasable programmable read only memory (EEPROM).

11. The system of claim 9 wherein the stored test values are complementary.

12. The system of claim 7 wherein K is less than 21 and greater than 1.

* * * * *